(12) United States Patent
Tsai

(10) Patent No.: US 10,283,972 B2
(45) Date of Patent: May 7, 2019

(54) CONTROL CIRCUIT AND METHOD OF BATTERY BRANCH IN BATTERY SYSTEM

(71) Applicant: Fu-Sheng Tsai, Taoyuan County (TW)

(72) Inventor: Fu-Sheng Tsai, Taoyuan County (TW)

( * ) Notice: Subject to any disclaimer, the term of this patent is extended or adjusted under 35 U.S.C. 154(b) by 368 days.

(21) Appl. No.: 14/191,439

(22) Filed: Feb. 27, 2014

(65) Prior Publication Data

US 2014/0239911 A1 Aug. 28, 2014

Related U.S. Application Data

(60) Provisional application No. 61/769,754, filed on Feb. 27, 2013.

(51) Int. Cl.
*H02J 7/00* (2006.01)
*H03K 5/04* (2006.01)

(52) U.S. Cl.
CPC ............ *H02J 7/0014* (2013.01); *H02J 7/007* (2013.01); *H03K 5/04* (2013.01); *H02J 7/0021* (2013.01); *Y02T 10/7055* (2013.01); *Y10T 307/747* (2015.04)

(58) Field of Classification Search
CPC ...... H02J 7/0016; H02J 7/0029; H02J 7/0072; H02J 7/0031; Y02E 60/12; B60L 11/18
USPC ............................ 320/71, 158, 159, 163, 164
See application file for complete search history.

(56) References Cited

U.S. PATENT DOCUMENTS

| | | | | |
|---|---|---|---|---|
| 2010/0102778 A1* | 4/2010 | Otsu | ................... | H01M 10/052 320/116 |
| 2011/0121812 A1* | 5/2011 | Salvestrini | ............. | H05B 39/04 323/323 |
| 2012/0105008 A1* | 5/2012 | Lipcsei | ................. | H02J 7/0083 320/134 |
| 2012/0175961 A1* | 7/2012 | Har-Shai | .................. | H02H 7/20 307/80 |
| 2012/0293130 A1* | 11/2012 | Burstein | ............... | H02J 7/0019 320/134 |
| 2013/0106354 A1* | 5/2013 | Suzuki | ................... | H02J 7/0016 320/116 |
| 2013/0175856 A1* | 7/2013 | Ojima | ................... | B60L 3/0023 307/9.1 |
| 2013/0187465 A1* | 7/2013 | Abe | ..................... | H01M 10/441 307/52 |

(Continued)

FOREIGN PATENT DOCUMENTS

JP 2007110887 4/2007

*Primary Examiner* — Drew A Dunn
*Assistant Examiner* — Harry O'Neill-Becerril
(74) *Attorney, Agent, or Firm* — Winston Hsu

(57) ABSTRACT

A control circuit of a battery branch in a battery system is provided. The control circuit includes a relay unit, a switch unit and a control unit. The relay unit is coupled to the battery branch. The switch unit is coupled in parallel with the relay unit. The control unit is coupled to the relay unit and the switch unit, and is arranged for controlling switching of the relay unit and the switch unit in order to selectively conduct a branch current flowing through the battery branch. A control method of a battery branch in a battery system is provided. The control method includes the following steps: coupling a relay unit to the battery branch, and coupling a switch unit in parallel with the relay unit; and controlling switching of the relay unit and the switch unit in order to selectively conduct a branch current flowing through the battery branch.

15 Claims, 7 Drawing Sheets

(56) References Cited

U.S. PATENT DOCUMENTS

2014/0103877 A1\* 4/2014 Sahu .................. H01M 10/482
                                                                            320/118

\* cited by examiner

CONTROL CIRCUIT AND METHOD OF BATTERY BRANCH IN BATTERY SYSTEM

CROSS REFERENCE TO RELATED APPLICATIONS

This application claims the benefit of U.S. provisional application No. 61/769,754, filed on Feb. 27, 2013, the contents of which are incorporated herein by reference.

BACKGROUND OF THE INVENTION

1. Field of the Invention

The disclosed embodiments of the present invention relate to control of a battery branch, and more particularly, to a control circuit of a battery branch in a battery system and a related control method.

2. Description of the Prior Art

In order to provide a high power battery system, a plurality of battery branches may be coupled in parallel to form the battery system, wherein each battery branch may include a plurality of battery cells (or battery modules) coupled in series. For example, ten battery branches (or battery strings), each of which allows a current of 66 A (Ampere) flowing therethrough, are connected in parallel to form a battery system capable of supplying/receiving a total current of 660 A. However, the large current flowing through each branch leads to a high power loss in the battery system.

SUMMARY OF THE INVENTION

It is therefore one objective of the present invention to provide a control circuit of a battery branch in a battery system and a related control method to solve the above problems.

According to an embodiment of the present invention, an exemplary control circuit of a battery branch in a battery system is disclosed. The exemplary control circuit comprises a relay unit, a switch unit and a control unit. The relay unit is coupled to the battery branch. The switch unit is coupled in parallel with the relay unit. The control unit is coupled to the relay unit and the switch unit, and is arranged for controlling switching of the relay unit and the switch unit in order to selectively conduct a branch current flowing through the battery branch.

According to an embodiment of the present invention, an exemplary control method of a battery branch in a battery system is disclosed. The exemplary control method comprises the following steps: coupling a relay unit to the battery branch, and coupling a switch unit in parallel with the relay unit; and controlling switching of the relay unit and the switch unit in order to selectively conduct a branch current flowing through the battery branch.

These and other objectives of the present invention will no doubt become apparent to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "coupled" is intended to mean either an indirect or direct electrical connection. Accordingly, if one device is electrically connected to another device, that connection may be through a direct electrical connection, or through an indirect electrical connection via other devices and connections.

In order to control a high power battery system (e.g. a battery system having a high input/output current), the proposed control circuit employs an architecture of a combination switch including a relay and a switch device coupled in parallel, wherein the switch device may be a metal-oxide-semiconductor field-effect transistor (MOSFET) switch. By controlling a switching sequence of the relay and the switch device, the proposed control circuit may reduce power loss in the battery system and increase system availability of the battery system.

Figure 1:
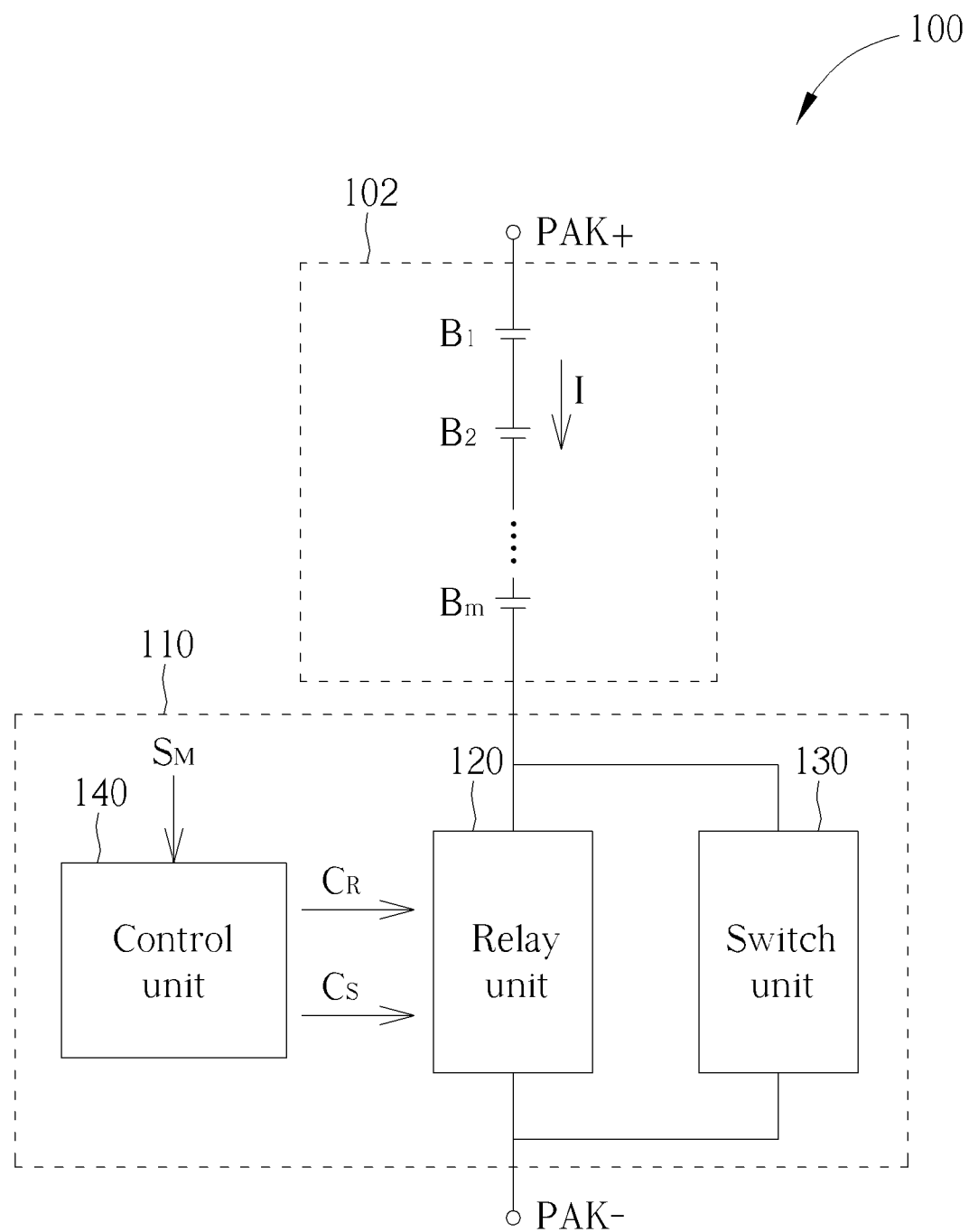
FIG. 1 is a diagram illustrating an exemplary control circuit of a battery branch in a battery system according to an embodiment of the present invention.

Please refer to FIG. 1, which is a diagram illustrating an exemplary control circuit of a battery branch in a battery system according to an embodiment of the present invention. In this embodiment, the battery system 100 may include the battery branch 102 and the control circuit 110, wherein the control circuit 110 may be used to control a branch current I flowing through the battery branch 102. The battery branch 102 may include, but is not limited to, a plurality of battery units $B_1$-$B_m$ connected in series, wherein each of the battery units $B_1$-$B_m$ may be a battery cell (i.e. a single battery), a battery block (i.e. including parallel-connected batteries), a battery module (i.e. including parallel-connected battery blocks) or a battery pack (i.e. including series-connected batteries and parallel-connected batteries). The battery units $B_1$-$B_m$ may provide required power for an externally coupled electronic apparatus (not shown in FIG. 1) from a node PAK+ (e.g. a high side terminal) and a node PAK- (e.g. a low side terminal), or receive charging power from the node PAK+ and the node PAK-. In an alternative design, the battery branch 102 may include a single battery unit.

The control circuit 110 may include a relay unit 120, a switch unit 130 and a control unit 140. The relay unit 120 is coupled to the battery unit $B_m$ (i.e. coupled to the battery branch 102). The switch unit 130 and the relay unit 120 are coupled in parallel between the battery unit $B_m$ and the node PAK-. In additional, the control unit 140 is coupled to the relay unit 120 and the switch unit 130, and is arranged for controlling switching of the relay unit 120 and the switch unit 130 in order to selectively conduct the branch current I. For example, the control unit 140 may generate a control signal $C_R$ to switch on or switch off the relay unit 120, and generate control signal $C_S$ to switch on or switch off the switch unit 130. The control unit 140 may further receive an operation mode signal $S_M$ to control the battery system 100 to operate in a charging mode (e.g. receiving charging power from the node PAK+ and the node PAK−) or a discharging mode (or an idle mode) (e.g. providing required power for an externally coupled electronic apparatus).

In one implementation, when the node PAK+ and the node PAK− are coupled to a charging apparatus (not shown in FIG. 1), the control unit 140 may generate the control signal $C_R$ and the control signal $C_S$ according to the operation mode signal $S_M$, thereby switching on the relay unit 120 and the switch unit 130 to conduct a charging current (i.e. the branch current I). In another implementation, when the node PAK+ and the node PAK− are coupled to an electronic apparatus (not shown in FIG. 1), the control unit 140 may generate the control signal $C_R$ and the control signal $C_S$ according to the operation mode signal $S_M$, thereby switching on the relay unit 120 and the switch unit 130 to provide electrical power (i.e. a discharging current) for the electronic apparatus. As a relay device is characterized by a low switch-on resistance and a low power consumption, the relay unit 120 may reduce an equivalent resistance between the battery branch 102 and the node PAK− effectively. Additionally, the parallel connection of the relay unit 120 and the switch unit 130 may further reduce the equivalent resistance between the battery branch 102 and the node PAK−, thus meeting the requirement of low power loss.

Please note that the relay unit 120 may need a switching time to switch on from a switch-off state (or switch off from a switch-on state) according to the control signal $C_R$, which may affects the operation of the electronic apparatus externally coupled to the battery system 100. For example, in a case where the electronic apparatus externally coupled to the battery system 100 is applied to high-speed data transmission, the electronic apparatus may delay transmitting data as the battery system 100 may delay supplying electrical power required by the electronic apparatus for the switching time.

In order to prevent the battery system 100 from being affected by the switching time of the relay unit 120, the switch unit 130 may have another switching time shorter than the switching time of the relay unit 120. For example, when the control unit 140 uses the control signal $C_R$ and the control signal $C_S$ to switch on the relay unit 120 and the switch unit 130 respectively, the switch unit 130 may provide a specific conduction path for a charging/discharging current before the relay unit 120 is switched on. Additionally, when the relay unit 120 and the switch unit 130 are both switched on, a current flowing through the battery branch 102 may be conducted mainly through the relay unit 120 if an equivalent impedance of the relay unit 120 is less than an equivalent impedance of the switch unit 130. In other words, the battery system 100 may not only meet the requirement of low power loss but also receive/supply electrical power (i.e. perform a charging/discharging operation) immediately.

Figure 2:
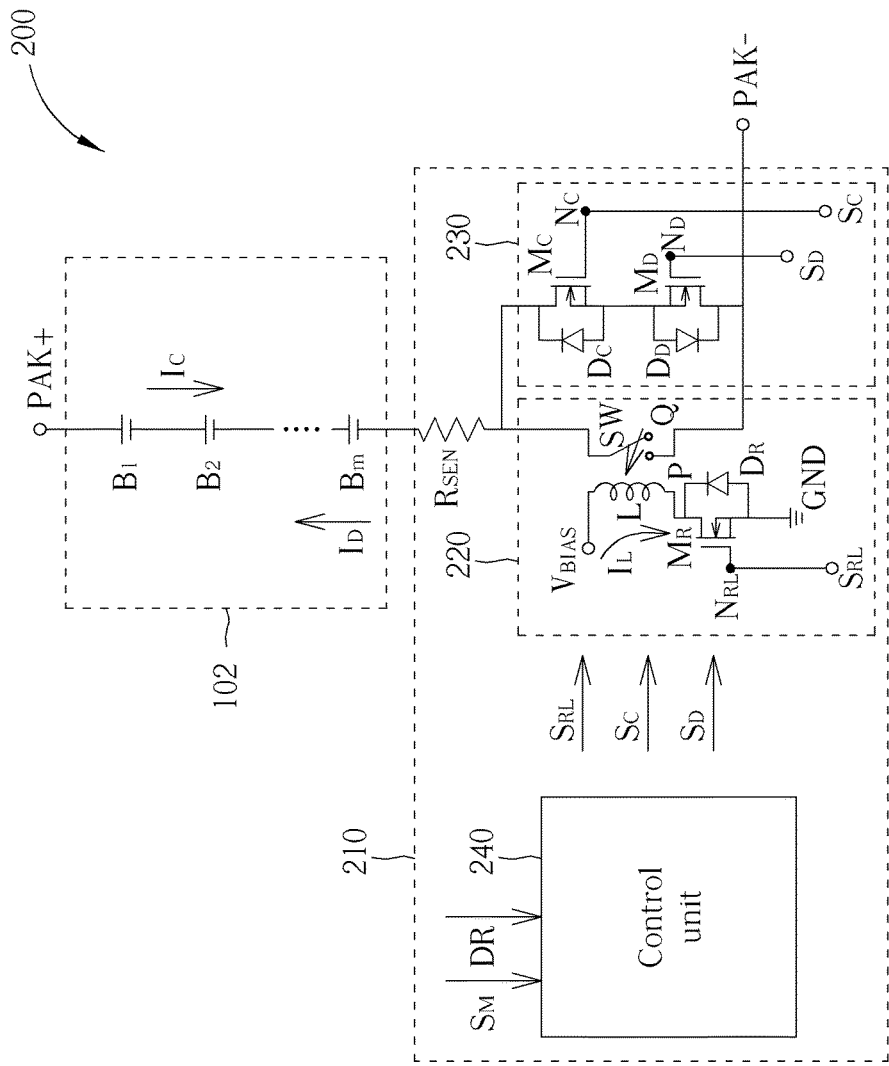
FIG. 2 is a diagram illustrating an exemplary control circuit of a battery branch in a battery system according to an embodiment of the present invention.

The control circuit 110 shown in FIG. 1 is a basic architecture based on the concept of the present invention. Any circuit employing the architecture shown in FIG. 1 falls within the scope of the present invention. To facilitate an understanding of the present invention, an exemplary implementation is given in the following for further description of the proposed control circuit. It should be noted that other circuit implementations employing the architecture shown in FIG. 1 are feasible. Please refer to FIG. 2, which is a diagram illustrating an exemplary control circuit of a battery branch in a battery system according to an embodiment of the present invention. As shown in FIG. 2, the battery system 200 may include the battery branch 102 shown in FIG. 1 and a control circuit 210, wherein the architecture of the control circuit 210 is based on that of the control circuit 110 shown in FIG. 1. In this embodiment, the control circuit 210 may include a relay unit 220, a switch unit 230, a control unit 240 and a sensing device $R_{SEN}$ (which is implemented by a resistor in this embodiment). The relay unit 220, the switch unit 230 and the control unit 240 may be used to implement the relay unit 120, the switch unit 130 and the control unit 140, respectively. The sensing device $R_{SEN}$ is coupled to battery branch 102, and is arranged for sensing a branch current flowing through the battery branch 102 (i.e. a branch current $I_C$ or a branch current $I_D$) to generate a sensing result DR. The control unit 240 may control switching of the relay unit 220 and the switch unit 230 according to the sensing result DR.

The relay unit 220 may include a coil L, a transistor $M_R$, an armature SW and a plurality of contacts P and Q. The coil L is coupled between a bias voltage $V_{BIAS}$ and the transistor $M_R$, and the transistor $M_R$ is coupled between the coil L and a ground voltage GND. The transistor $M_R$ may be implemented by a MOSFET and hence have a control terminal $N_{RL}$ and a body diode $D_R$. The switch unit 230 may include a transistor $M_C$ and a transistor $M_D$. The transistor $M_C$ is coupled between the sensing device $R_{SEN}$ and the transistor $M_D$, and the transistor $M_D$ is coupled between the transistor $M_C$ and the node PAK−. In this embodiment, each of the transistor $M_C$ and the transistor $M_D$ may be implemented by a MOSFET. Hence, the transistor $M_C$ may have a control terminal $N_C$ and a body diode $D_C$, and the transistor $M_D$ may have a control terminal $N_D$ and a body diode $D_D$, wherein the body diode $D_C$ and the body diode $D_D$ are coupled in opposite directions.

The control unit 240 may generate a control signal $S_{RL}$ to the control terminal $N_{RL}$ to control a switching state of the transistor $M_R$, thereby controlling a switching state of the relay unit 220. By way of example but not limitation, the relay unit 220 may be a normally closed relay. Hence, when the transistor $M_R$ is turned on according to the control signal $S_{RL}$, the current $I_L$ may flow through the coil L to introduce a magnetic field, thereby activating the armature SW to separate the contacts P and Q.

Figure 3:
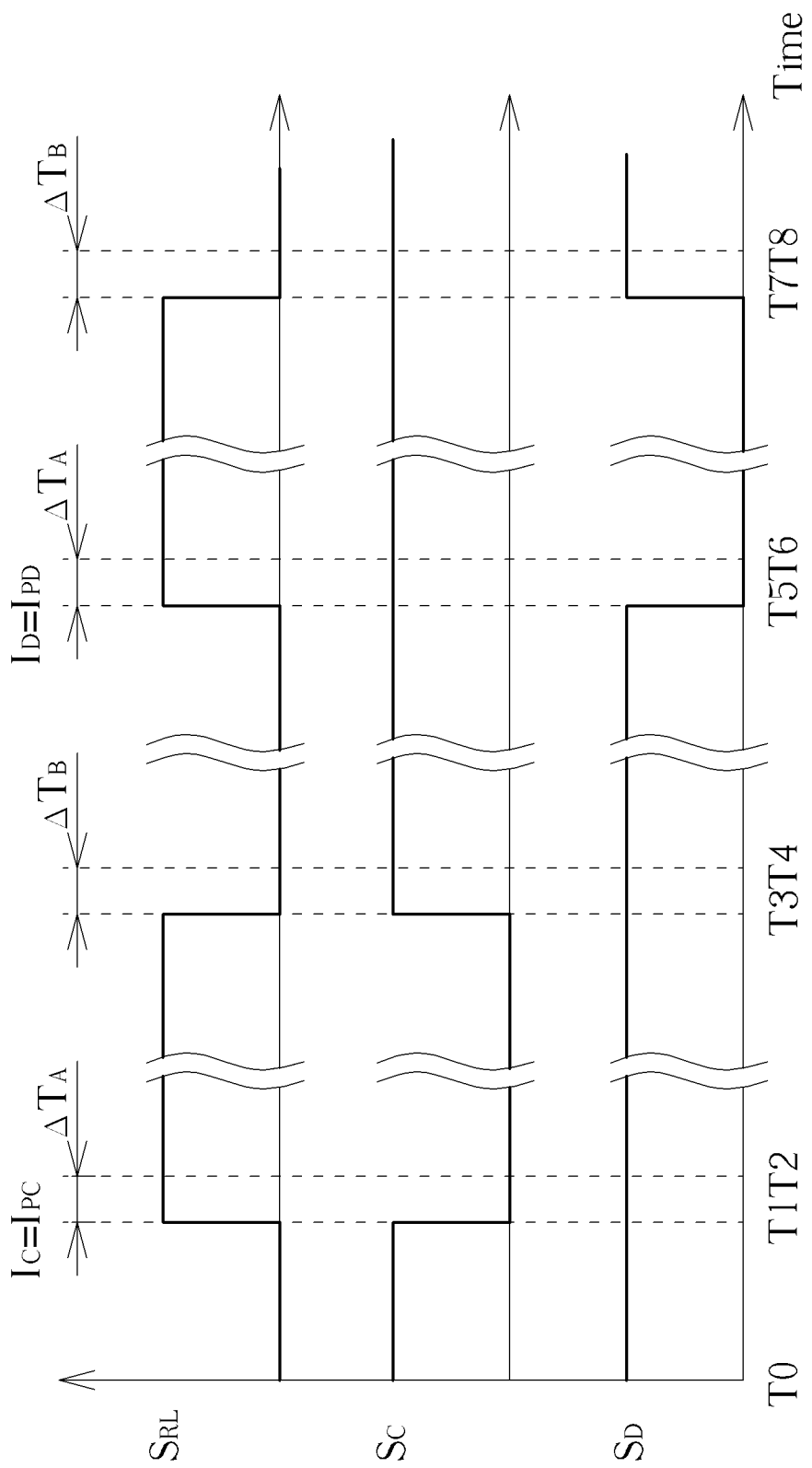
FIG. 3 is an exemplary timing diagram of the control signals shown in FIG. 2.

Please refer to FIG. 3 in conjunction with FIG. 2 for a further understanding of the operation of the control circuit 240 shown in FIG. 2. FIG. 3 is an exemplary timing diagram of the control signals $S_{RL}$, $S_C$ and $S_D$ shown in FIG. 2. At a time point T0, the battery system 200 operates in a charging mode, wherein the transistor $M_R$ is turned off according to control signal $S_{RL}$ in order to maintain the relay unit 220 switched on (i.e. the contact P and the contact Q are connected to each other). In addition, the transistor $M_C$ and the transistor $M_D$ are turned on according to the control signal $S_C$ and the control signal $S_D$, respectively (i.e. the switch unit 230 is switched on).

When the sensing result DR indicates that the charging current (i.e. the branch current $I_C$) is decreased to reach a predetermined current value $I_{PC}$ (e.g. the battery branch 102 is fully charged), the control unit 240 may switch off the relay unit 220 and the switch unit 230 to cut off a charging path (i.e. at a time point T1). Specifically, the control signal $S_{RL}$ switches to a high level to turn on the transistor $M_R$, thereby separating the contact P and the contact Q. Additionally, the control signal $S_C$ switches to a low level to turn off the transistor $M_C$ while the control signal $S_D$ stays at a high level to maintain the transistor $M_D$ turned on. Hence, a charging apparatus (not shown in FIG. 2) externally coupled to the battery system 200 may stop charging the battery system 200. It should be noted that, after the control unit 240 switches a signal level of the control signal $S_{RL}$, a period of time $\Delta T_A$ (as shown in FIG. 3) is required to separate the contact P and the contact Q. In other words, the period of time $\Delta T_A$ is a switching time required to switch off the relay unit 220 in a switch-on state. Compared with the period of time $\Delta T_A$, a switching time required to turn off the transistor $M_C$ in a turn-on state is negligible. Thus, during a period of time from the time point T1 to a time point T2, the contacts P and Q remain connected to each other, the transistor $M_C$ substantially stays in a turn-off state, and the branch current $I_C$ may still flow toward the node PAK− through the relay unit 220.

Next, at a time point T3, the control unit 240 may switch the battery system 200 to operate in a discharging mode according to the operation mode signal $S_M$. For example, the battery system 200 may provide electrical power for an externally coupled electronic apparatus (not shown in FIG. 2). The control unit 240 may switch on the relay unit 220 and the switch unit 230 to provide a discharging current (i.e. the branch current $I_D$) for the externally coupled electronic apparatus. Specifically, the control signal $S_{RL}$ switches to a low level to turn off the transistor $M_R$, thus allowing the contact P and the contact Q to be connected to each other. Additionally, the control signal $S_C$ switches to a high level to turn on the transistor $M_C$ while the control signal $S_D$ stays at the high level to maintain the transistor $M_D$ turned on. It should be noted that, after the control unit 240 switches the signal level of the control signal $S_{RL}$, a period of time $\Delta T_B$ is required to connect the contacts P and Q to each other (as shown in FIG. 3). In other words, the period of time $\Delta T_B$ is a switching time required to switch on the relay unit 220 in a switch-off state. Compared with the period of time $\Delta T_B$, a switching time required to turn on the transistor $M_C$ in a turn-off state is negligible. Thus, during the period of time $\Delta T_B$ (from the time point T3 to a time point T4), the contacts P and Q are separated, the transistor $M_C$ substantially stays in a turn-on state, and the branch current $I_D$ may still flow toward the battery branch 102 through the transistor $M_C$ and the transistor $M_D$. Additionally, as the transistor $M_D$ stay in the turn-on state according to the control signal $S_D$, the branch current $I_D$ may flow toward the battery branch 102 through the transistor $M_D$ and the body diode $D_C$ before the transistor $M_C$ is turned on. In brief, the electrical power may be provided for the externally coupled electronic apparatus without delay.

When the sensing result DR indicates that the branch current $I_D$ is decreased to reach a predetermined current value $I_{PD}$ (e.g. all or almost all of the electrical power stored in the battery branch 102 has been provided for the externally coupled electronic apparatus), the control unit 240 may switch off the relay unit 220 and the switch unit 230 to cut off a discharging path (i.e. at a time point T5). Specifically, the control signal $S_{RL}$ switches to the high level to turn on the transistor $M_R$, thereby separating the contact P and the contact Q. Additionally, the control signal $S_D$ switches to the low level to turn off the transistor $M_D$ while the control signal $S_C$ stays at the high level to maintain the transistor $M_C$ turned on. Hence, the battery system 200 may stop power supply. Similarly, the period of time $\Delta T_A$ is required to switch off the relay unit 220 in the switch-on state, and a switching time required to turn off the transistor $M_D$ in a turn-on state is negligible when compared with the period of time $\Delta T_A$. Thus, during the period of time $\Delta T_A$ (from the time point T5 to a time point T6), the branch current $I_D$ may still flow toward the battery branch 102 through the relay unit 220.

Next, at a time point T7, the control unit 240 may switch the battery system 200 to operate in the charging mode according to the operation mode signal $S_M$. The control unit 240 may switch on the relay unit 220 and the switch unit 230, allowing the branch current $I_C$ to charge the battery branch 102. Specifically, the control signal $S_{RL}$ switches to the low level to turnoff the transistor $M_R$, thus allowing the contact P and the contact Q to be connected to each other. Additionally, the control signal $S_D$ switches to the high level to turn on the transistor $M_D$ while the control signal $S_C$ stays at the high level to maintain the transistor $M_C$ turned on. Similarly, the period of time $\Delta T_B$ is required to switch on the relay unit 220 in the switch-off state, and a switching time required to turn on the transistor $M_D$ in a turn-off state is negligible when compared with the period of time $\Delta T_B$. Thus, during a period of time from the time point T7 to a time point T8, the branch current $I_C$ may still flow toward the node PAK− through the transistor $M_C$ and the body diode $D_D$. In brief, the battery system 200 may be charged without delay.

In view of the above, the transistor $M_C$ may be regarded as a charging transistor, which may be used to control a charging operation of the battery system 200, and the transistor $M_D$ may be regarded as a discharging transistor, which may be used to control a discharging operation of the battery system 200.

Figure 4:
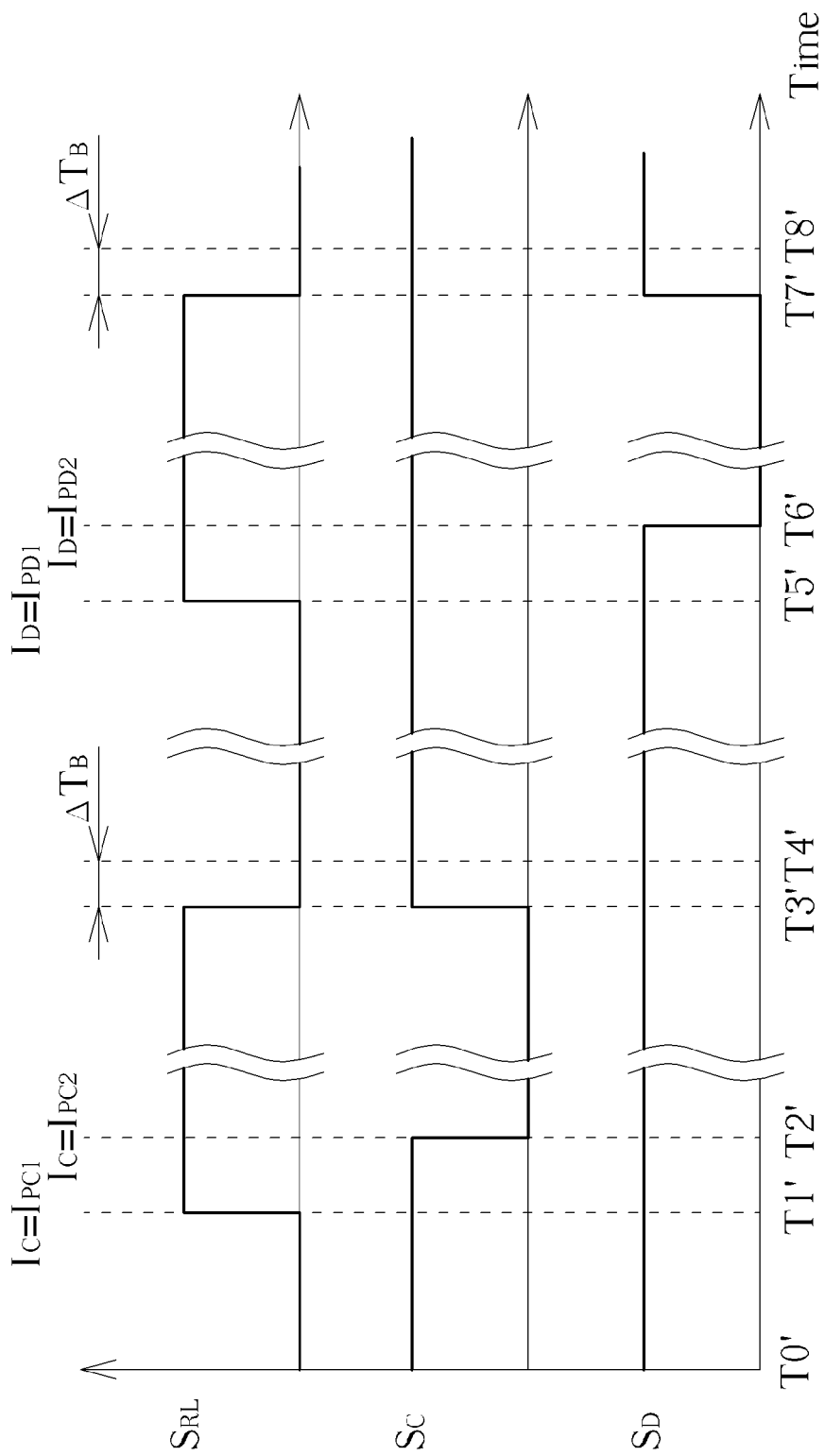
FIG. 4 is another exemplary timing diagram of the control signals shown in FIG. 2.

When the battery system 200 is almost, but not quite, fully charged, the charging apparatus may float charge the battery system 200 (e.g. charging the battery system 200 with a constant voltage or a low charging current). However, current fluctuation of the low charging current of a float charge operation may switch on and switch off the relay unit 220 alternately and frequently, resulting in a reduced life of the relay unit 220. Please refer to FIG. 4 in conjunction with FIG. 2. FIG. 4 is another exemplary timing diagram of the control signals $S_{RL}$, $S_C$ and $S_D$ shown in FIG. 2. In order to avoid switching the relay unit 220 frequently, in this implementation, a conduction path of the branch current may be provided mainly by the switch unit 230 when the branch current is low. Further description is detailed below.

At a time point T0′, the battery system 200 operates in the charging mode, wherein the transistor $M_R$ is turned off according to control signal $S_{RL}$ in order to maintain the relay unit 220 switched on, and the transistor $M_C$ and the transistor $M_D$ are turned on according to the control signal $S_C$ and the control signal $S_C$, respectively. When the sensing result DR indicates that the charging current (i.e. the branch current $I_C$) is decreased to reach a first predetermined current value $I_{PC1}$ (e.g. the battery branch 102 is almost, but not quite, fully charged), the control unit 240 may switch off the relay unit 220 and maintain the switch unit 230 switched on (i.e. at a time point T1′). Specifically, the control signal $S_{RL}$ switches to a high level to turn on the transistor $M_R$, thereby separating the contact P and the contact Q. Additionally, each of the control signal $S_C$ and the control signal $S_D$ stays at a high level to maintain the corresponding transistor (i.e. the transistor $M_C$ and the transistor $M_D$) turned on. Hence, the life of the relay unit 220 may be improved.

When the sensing result DR indicates that the branch current $I_C$ is decreased to reach a second predetermined current value $I_{PC2}$ smaller than the first predetermined current value $I_{PC1}$ (e.g. the battery branch 102 is fully charged), the control unit 240 may maintain the relay unit 220 switched off and switch off the switch unit 230 to cut off a charging path (i.e. at a time point T2'). Specifically, each of the control signal $S_{RL}$ and the control signal $S_D$ stays at the high level, and the control signal $S_C$ switches to a low level to turn off the transistor $M_C$.

Next, at a time point T3', the control unit 240 may switch the battery system 200 to operate in the discharging mode according to the operation mode signal $S_M$. Specifically, the control unit 240 may switch the control signal $S_{RL}$ to a low level in order to turn off the transistor $M_R$, thus allowing the contact P and the contact Q to be connected to each other (i.e. the relay unit 220 is switched on). Additionally, the control unit 240 may switch the control signal $S_C$ to a high level to turn on the transistor $M_C$, and keep the control signal $S_D$ at the high level to maintain the transistor $M_D$ turned on. Similarly, after the control unit 240 switches a signal level of the control signal $S_{RL}$, the period of time $\Delta T_B$ is required to connect the contacts P and Q to each other. Thus, before the relay unit 220 is switched on (i.e. before a time point T4'), the branch current $I_D$ may flow toward the battery branch 102 substantially through the switch unit 230.

When the sensing result DR indicates that the branch current $I_D$ is decreased to reach a first predetermined $I_{PD1}$ current value (e.g. most of the electrical power stored in battery branch 102 has been provided for the external coupled electronic apparatus), the control unit 240 may switch off the relay unit 220 and maintain the switch unit 230 switched on (i.e. at a time point T5'). Specifically, the control signal $S_{RL}$ switches to the high level to turn on the transistor $M_R$, thereby separating the contact P and the contact Q. Additionally, each of the control signal $S_C$ and the control signal $S_D$ stays at the high level to maintain the corresponding transistor (i.e. the transistor $M_C$ and the transistor $M_D$) turned on. Next, when the sensing result DR indicates that the branch current $I_D$ is decreased to reach a second predetermined current value $I_{PD2}$ smaller than the first predetermined current value $I_{PD1}$ (e.g. the battery branch 102 is fully discharged), the control unit 240 may maintain the relay unit 220 switched off and switch off the switch unit 230 to cut off a discharging path (i.e. at a time point T6'). Specifically, each of the control signal $S_{RL}$ and the control signal $S_C$ stays at the high level, and the control signal $S_D$ switches to the low level to turn off the transistor $M_D$.

At a time point T7, the control unit 240 may switch the battery system 200 to operate in the charging mode according to the operation mode signal $S_M$. The control unit 240 may switch on the relay unit 220 and the switch unit 230, allowing the branch current $I_C$ to charge the battery branch 102. Specifically, the control signal $S_{RL}$ switches to the low level to turn off the transistor $M_R$, thus allowing the contact P and the contact Q to be connected to each other. Additionally, the control signal $S_D$ switches to the high level to turn on the transistor $M_D$ while the control signal $S_C$ stays at the high level to maintain the transistor $M_C$ turned on. Similarly, after the control unit 240 switches a signal level of the control signal $S_{RL}$, the period of time $\Delta T_B$ is required to connect the contacts P and Q to each other. Thus, before the relay unit 220 is switched on (i.e. at a time point T8'), the branch current $I_C$ may flow toward the node PAK− substantially through the switch unit 230.

Please note that the above is for illustrative purposes only, and is not meant to be a limitation of the present invention. In one implementation, the relay unit 220 may be implemented by other types of relays (e.g. a normally open relay). In another implementation, switches device included in the switch unit 230 may be implemented by other types of switch devices, and the number of the switches device included in the switch unit 230 is not limited to two. Instill another implementation, the control unit 240 may determine whether the charging/discharging operation of the battery system 200 is completed based on other criteria instead of the sensing result DR generated by the sensing device $R_{SEN}$. For example, the control unit 240 may determine whether the charging operation is completed by comparing a total voltage of the battery unit $B_1$-$B_m$ with a charging voltage of the charging apparatus. In another example, the control unit 240 may determine whether the charging operation is completed by detecting temperature of the battery system 200. In still another example, the control unit 240 may determine whether the charging/discharging operation is completed according to charge/discharge time. In brief, any battery branch control circuit having the architecture of the control circuit 110 shown in FIG. 1 falls within the scope of the present invention.

Figure 5:
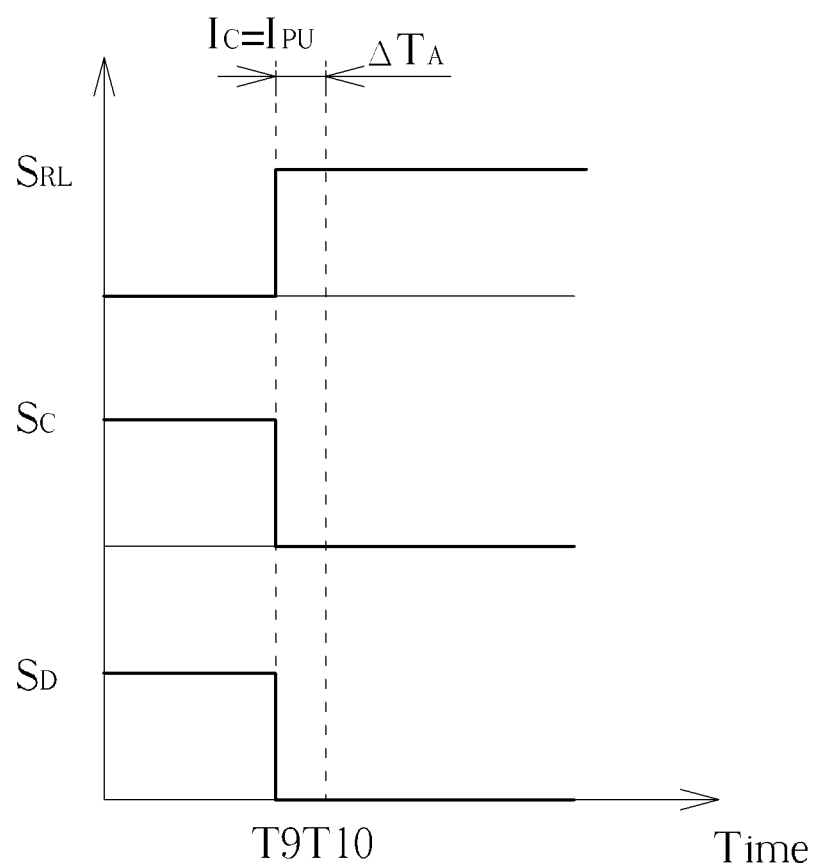
FIG. 5 is another exemplary timing diagram of the control signals shown in FIG. 2.

The proposed control circuit may be applied to over-current protection (or short-current protection). Please refer to FIG. 5 in conjunction with FIG. 2. FIG. 5 is another exemplary timing diagram of the control signals $S_{RL}$, $S_C$ and $S_D$ shown in FIG. 2. In this implementation, the battery system 200 operates in the charging mode. When the sensing result DR indicates that the branch current $I_C$ is larger than a current upper bound $I_{PU}$, the control unit 240 may switch off the relay unit 220 and the switch unit 230 (i.e. at a time point T9). Specifically, the control unit 240 may switch the control signal $S_{RL}$ to a high level to turn on the transistor $M_R$, thereby separating the contact P and the contact Q. Additionally, the control unit 240 may switch the control signal $S_C$ and the control signal $S_D$ to low levels to turn off the transistor $M_C$ and the transistor $M_D$, respectively. It should be noted that the period of time $\Delta T_A$ is required to switch in the relay unit 220 in a switch-off state. Thus, during a period of time from the time point T9 to a time point T10, the branch current $I_C$ (i.e. an overcurrent) may flow toward the node PAK− substantially through the relay unit 220, thus preventing the overcurrent from damaging the transistor $M_C$ and the transistor $M_D$.

In addition, regarding a battery system including a plurality of battery branches coupled in parallel, at least one of the battery branches may be controlled by the proposed control circuit (e.g. the control circuit 210 shown in FIG. 2), and rest of the battery branches may be controlled by relay circuits (e.g. a control circuit including the relay unit 220 shown in FIG. 2)

Figure 6:
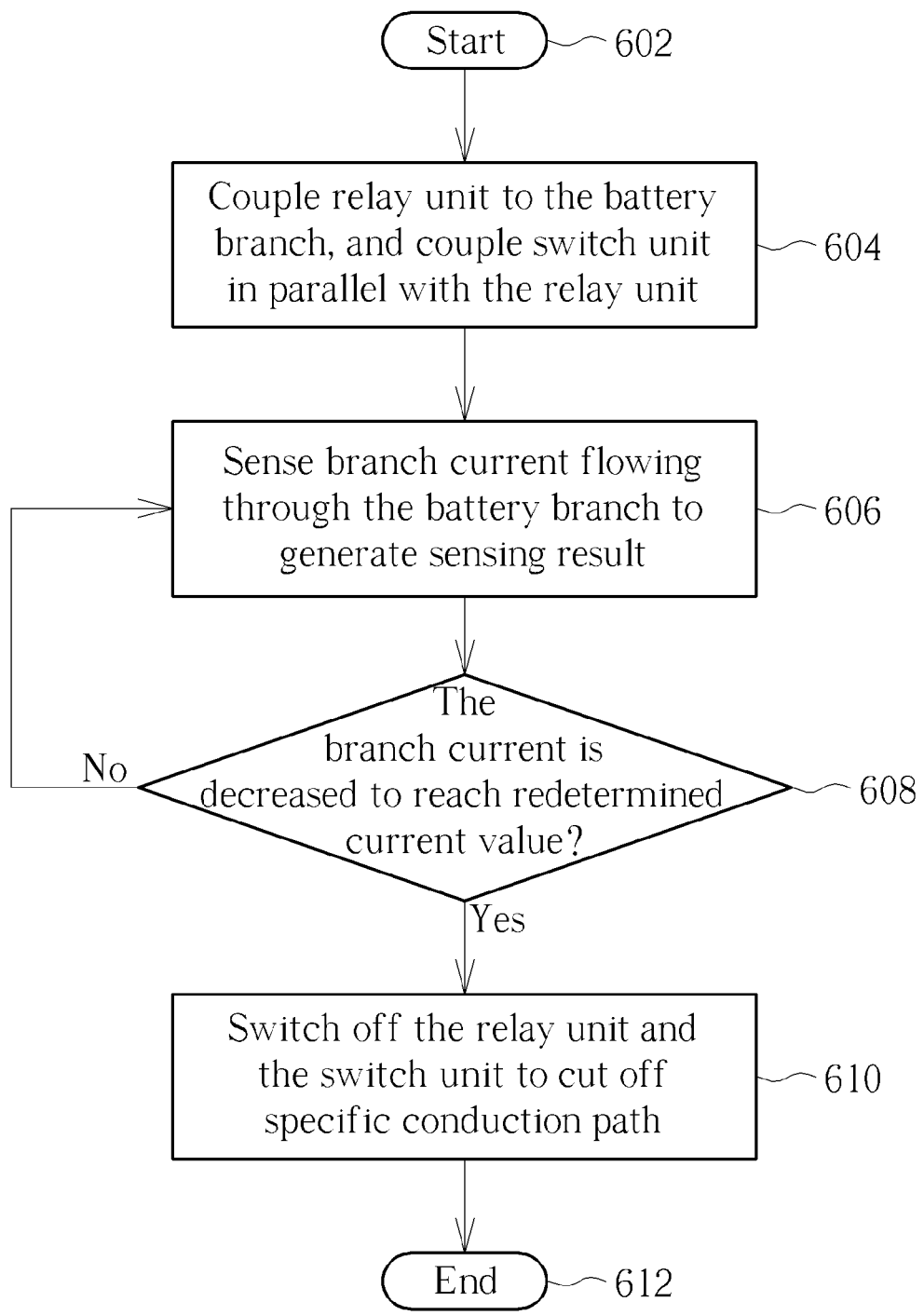
FIG. 6 is a flowchart of an exemplary control method of a battery branch in a battery system.

Please refer to FIG. 6, which is a flowchart of an exemplary control method of a battery branch in a battery system. The exemplary control method may be employed to the control circuit 210 shown in FIG. 2, and may be summarized as follows.

Step 602: Start.

Step 604: Couple a relay unit to the battery branch, and couple a switch unit in parallel with the relay unit.

Step 606: Sense a branch current flowing through the battery branch to generate a sensing result.

Step 608: Determine whether the branch current is decreased to reach a predetermined current value according to the sensing result. If yes, go to step 610; otherwise, return to step 606.

Step 610: Switch off the relay unit and the switch unit to cut off a specific conduction path.

Step 612: End.

In step 610, the flow may determine the specific conduction path (e.g. a charging path or a discharging path) to be cut off according to an operation mode of the battery system. As a person skilled in the art should understand the operation of each step shown in FIG. 6 after reading the paragraphs directed to FIG. 1-FIG. 3, further description is omitted here for brevity.

Figure 7:
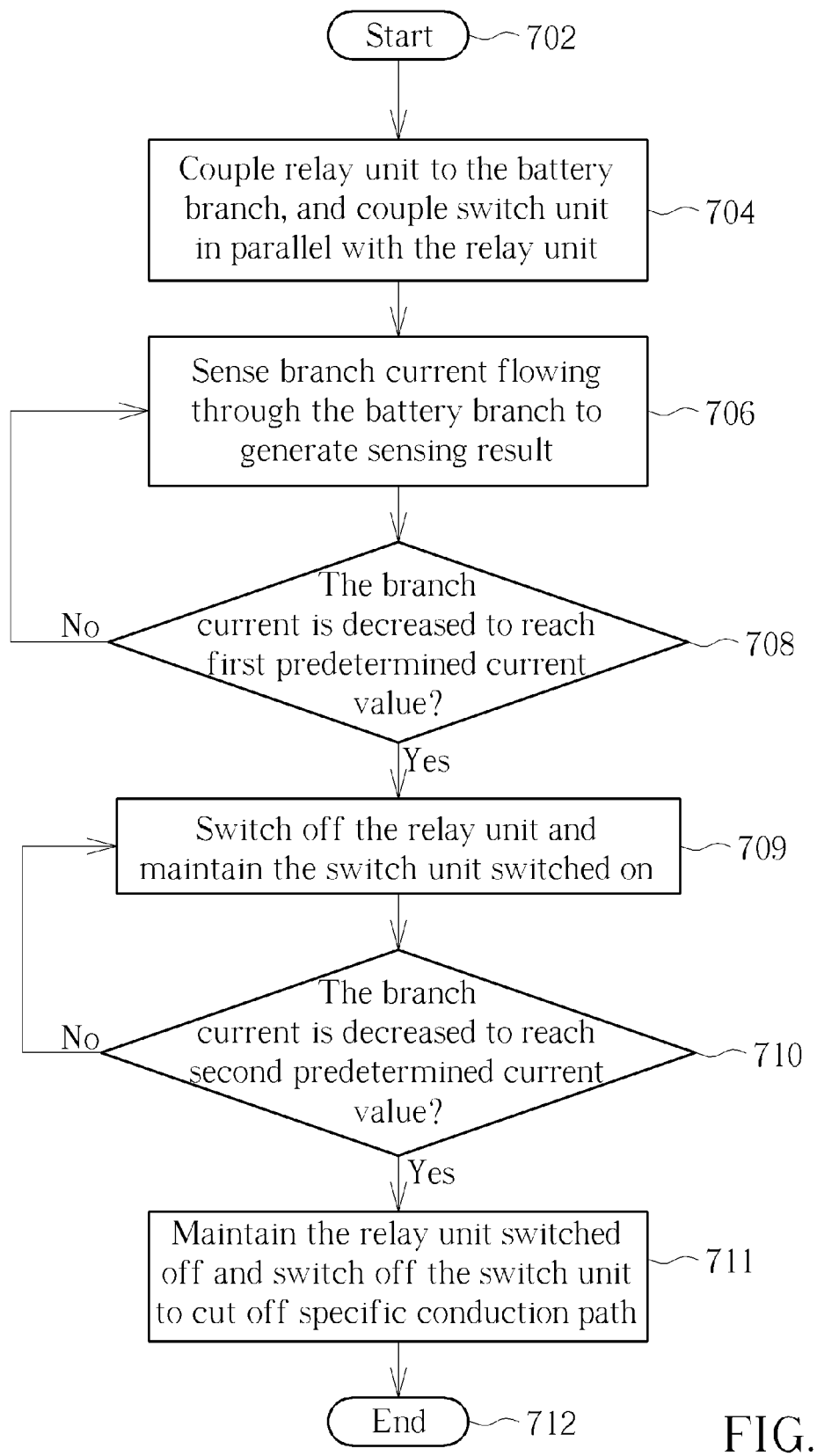
FIG. 7 is a flowchart of another exemplary control method of a battery branch in a battery system.

Please refer to FIG. 7, which is a flowchart of another exemplary control method of a battery branch in a battery system. The exemplary control method may be employed to the control circuit 210 shown in FIG. 2, and may be summarized as follows.

Step 702: Start.

Step 704: Couple a relay unit to the battery branch, and couple a switch unit in parallel with the relay unit.

Step 706: Sense a branch current flowing through the battery branch to generate a sensing result.

Step 708: Determine whether the branch current is decreased to reach a first predetermined current value according to the sensing result. If yes, go to step 709; otherwise, return to step 706.

Step 709: Switch off the relay unit and maintain the switch unit switched on.

Step 710: Determine whether the branch current is decreased to reach a second predetermined current value smaller than the first predetermined current value according to the sensing result. If yes, go to step 711; otherwise, return to step 709.

Step 711: Maintain the relay unit switched off, and switch off the switch unit to cut off a specific conduction path.

Step 712: End.

In step 710, the flow may determine the specific conduction path (e.g. a charging path or a discharging path) to be cut off according to an operation mode of the battery system. As a person skilled in the art should understand the operation of each step shown in FIG. 7 after reading the paragraphs directed to FIG. 1-FIG. 4, further description is omitted here for brevity.

To sum up, the proposed control circuit may reduce power loss in a battery system, increase system availability of the battery system, prolong a life of a relay device and/or a battery system, and provide over-current protection (short-current protection).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control circuit of a battery branch in a battery system, comprising:
   a relay unit, coupled to the battery branch;
   a switch unit, coupled in parallel with the relay unit, the switching unit comprising a first transistor and a second transistor;
   a sensing device, coupled to the battery branch, the sensing device arranged for sensing a branch current to generate a sensing result; and
   a control unit, coupled to the relay unit and the switch unit, the control unit arranged for controlling switching of the relay unit and the switch unit according to the sensing result in order to selectively conduct the branch current flowing through the battery branch;
   wherein when the sensing result indicates that the branch current reaches a first predetermined current value, the control unit switches off the relay unit, and refers to the sensing result to switch off the first transistor and maintain the second transistor turned on for keeping a first conduction path before the relay unit in a switch-off state is switched on; and when the sensing result indicates that the branch current reaches a second predetermined current value, the control unit switches off the relay unit, and refers to the sensing result to switch off the second transistor and maintain the first transistor turned on for keeping a second conduction path before the relay unit in the switch-off state is switched on.

2. The control circuit of claim 1, wherein a switching time of the switch unit is shorter than a switching time of the relay unit.

3. The control circuit of claim 1, wherein the first conduction path is a discharging path.

4. The control circuit of claim 1, wherein the second conduction path is a charging path.

5. The control circuit of claim 1, wherein when the sensing result indicates that the branch current is larger than a current upper bound, the control unit switches off the relay unit and the switch unit.

6. The control circuit of claim 1, wherein the first transistor has a first body diode, the second transistor is coupled in series with the first transistor and has a second body diode, and the second body diode and the first body diode are coupled in opposite directions.

7. The control circuit of claim 1, wherein the first transistor is arranged for controlling a charging operation of the battery system, and the second transistor is arranged for controlling a discharging operation of the battery system.

8. The control circuit of claim 1, wherein the control unit receives an operation mode signal to control the battery system to operate in a charging mode or a discharging mode; and after the control unit switches off the relay unit, turns off the first transistor and turns on the second transistor, the control unit switches on the relay unit and turns on the first transistor when the control unit switches the battery system to the charging mode or the discharging mode according to the operation mode signal.

9. The control circuit of claim 1, wherein when the relay unit and the switch unit are both switched on, an equivalent impedance of the relay unit is less than an equivalent impedance of the switch unit.

10. The control circuit of claim 1, wherein when the relay unit in the switch-off state is switched on, the control unit maintains each of the first transistor and the second transistor turned on.

11. A control method of a battery branch in a battery system, comprising:
    coupling a relay unit to the battery branch, coupling a first transistor and a second transistor to form a switch unit, and coupling the switch unit in parallel with the relay unit; and
    controlling switching of the relay unit and the switch unit in order to selectively conduct a branch current flowing through the battery branch;
    wherein the step of controlling switching of the relay unit and the switch unit comprises:
    sensing the branch current to generate a sensing result, and controlling the switching of the relay unit and the switch unit according to the sensing result;
    wherein when the sensing result indicates that the branch current reaches a first predetermined current value, the step of controlling the switching of the relay unit and the switch unit according to the sensing result comprises:

switching off the relay unit, and referring to the sensing result to switch off the first transistor and maintain the second transistor turned on for keeping a first conduction path before the relay unit in a switch-off state is switched on;

wherein when the sensing result indicates that the branch current reaches a second predetermined current value, the step of controlling the switching of the relay unit and the switch unit according to the sensing result comprises:

switching off the relay unit, and referring to the sensing result to switch off the second transistor and maintain the first transistor turned on for keeping a second conduction path before the relay unit in the switch-off state is switched on.

12. The control method of claim 11, wherein a switching time of the switch unit is shorter than a switching time of the relay unit.

13. The control method of claim 11, wherein the first conduction path is a discharging path.

14. The control method of claim 11, wherein the second conduction path is a charging path.

15. The control method of claim 11, when the sensing result indicates that the branch current is larger than a current upper bound, the step of controlling the switching of the relay unit and the switch unit according to the sensing result further comprises:

switching off the relay unit and the switch unit.

\* \* \* \* \*